(12) United States Patent
Mei et al.

(10) Patent No.: US 11,357,115 B2
(45) Date of Patent: Jun. 7, 2022

(54) HOUSING ASSEMBLY AND ELECTRONIC DEVICE USING SAME

(71) Applicants: HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Zhen-Hai Mei, Zhengzhou (CN); Fu-Pin Hsieh, New Taipei (TW); Bo-Duo Yuan, Shenzhen (CN); Xi-Juan Luo, Zhengzhou (CN)

(73) Assignees: HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 162 days.

(21) Appl. No.: 16/893,637

(22) Filed: Jun. 5, 2020

(65) Prior Publication Data

US 2021/0204415 A1 Jul. 1, 2021

(30) Foreign Application Priority Data

Dec. 27, 2019 (CN) .......................... 201911375228.8

(51) Int. Cl.
*H05K 5/00* (2006.01)
*H04M 1/02* (2006.01)
*H05K 5/02* (2006.01)

(52) U.S. Cl.
CPC ........ *H05K 5/0004* (2013.01); *H04M 1/0262* (2013.01); *H05K 5/0247* (2013.01)

(58) Field of Classification Search
None
See application file for complete search history.

(56) References Cited

U.S. PATENT DOCUMENTS

| | | | | |
|---|---|---|---|---|
| 5,693,908 A | * | 12/1997 | Amberger | H02G 3/083 |
| | | | | 174/656 |
| 6,288,331 B1 | * | 9/2001 | Wirthwein | H02G 3/0437 |
| | | | | 174/481 |
| 7,579,556 B2 | * | 8/2009 | Tapper | H02G 3/088 |
| | | | | 16/2.1 |
| 7,781,684 B2 | * | 8/2010 | Stuckmann | H02G 3/088 |
| | | | | 174/650 |
| 8,134,840 B2 | * | 3/2012 | Yoshida | H04M 1/0277 |
| | | | | 361/752 |

(Continued)

*Primary Examiner* — Xanthia C Cunningham
(74) *Attorney, Agent, or Firm* — ScienBiziP, P.C.

(57) ABSTRACT

A housing assembly for an electronic device, which allows the installation of a larger and more powerful battery includes a first housing and a second housing. The second housing is received in the first housing. A groove is formed on a surface of the first housing facing the second housing. The second housing includes a first side plate, a second side plate facing to the first side plate, a bottom plate, and a fastener. The first side plate and the second side plate are disposed on sides of the bottom plate to form a receiving space. The first side plate and the second side plate are connected to the first housing. The fastener is disposed on the first side plate or the second side plate, and received in the groove. An electronic device using the housing assembly is also provided.

15 Claims, 7 Drawing Sheets

(56) References Cited

U.S. PATENT DOCUMENTS

| | | | | |
|---|---|---|---|---|
| 8,153,910 B1* | 4/2012 | Penczak | ............... | H02G 3/185 |
| | | | | 174/486 |
| 8,164,008 B2* | 4/2012 | Maruyama | ............ | H02K 5/225 |
| | | | | 174/657 |
| 8,791,376 B2* | 7/2014 | Endt | ............... | H02G 3/22 |
| | | | | 174/663 |
| 9,686,875 B2* | 6/2017 | Miyake | ............... | H05K 7/1471 |
| 10,178,783 B2* | 1/2019 | Yonemaru | ............ | H05K 5/0217 |
| 10,184,643 B2* | 1/2019 | Oksengendler | ...... | F21V 17/166 |
| 2009/0200057 A1* | 8/2009 | Caveney | ............... | H02G 3/045 |
| | | | | 174/101 |
| 2011/0030832 A1* | 2/2011 | Larson | ............... | F16L 3/08 |
| | | | | 138/137 |
| 2014/0267957 A1* | 9/2014 | Iwamoto | ............ | G02F 1/13338 |
| | | | | 349/12 |
| 2018/0234772 A1* | 8/2018 | Meng | ............... | H04R 7/18 |
| 2018/0309862 A1* | 10/2018 | Chen | ............... | H01M 50/247 |
| 2019/0237282 A1* | 8/2019 | Ford | ............... | H05K 1/18 |

* cited by examiner

HOUSING ASSEMBLY AND ELECTRONIC DEVICE USING SAME

FIELD

The disclosure generally relates to a housing assembly and an electronic device using same.

BACKGROUND

Electronic devices may have electronic components and batteries for supplying power to electronic components. With the development of the electronic device, the service life of the battery needs to be increased. However, a longer service life of the battery may result in an increase in the size of the battery. Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION

Figure 1:
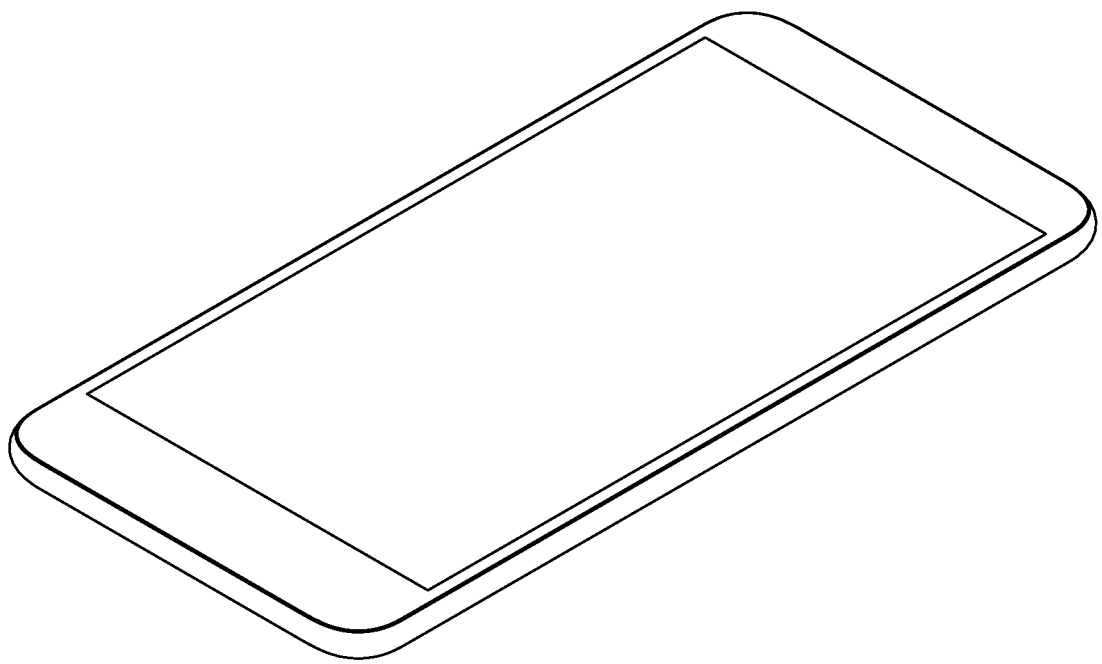
FIG. 1 is a perspective view of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiment described herein can be practiced without these specific details. In other instances, methods, procedures, and components have not been described in detail so as not to obscure the related relevant feature being described. Further, the description is not to be considered as limiting the scope of the embodiments described herein. The drawings are not necessarily to scale and the proportions of certain parts may be exaggerated to better illustrate details and features of the present disclosure.

The term "comprising" when utilized, means "include, but is not limited to"; it specifically indicates open-ended inclusion or membership in the so-described combination, group, series, and the like. The term "coupled" when utilized, means "either a direct electrical connection between the things that are connected, or an indirect connection through one or more passive or active intermediary devices, but is not limited to".

FIG. 1 illustrates an embodiment of an electronic device 100. In at least one embodiment, the electronic device 100 is a mobile phone. In other embodiments, the electronic device 100 may be, but is not limited to, a tablet computer, a notebook computer, and a smart watch.

Figure 2:
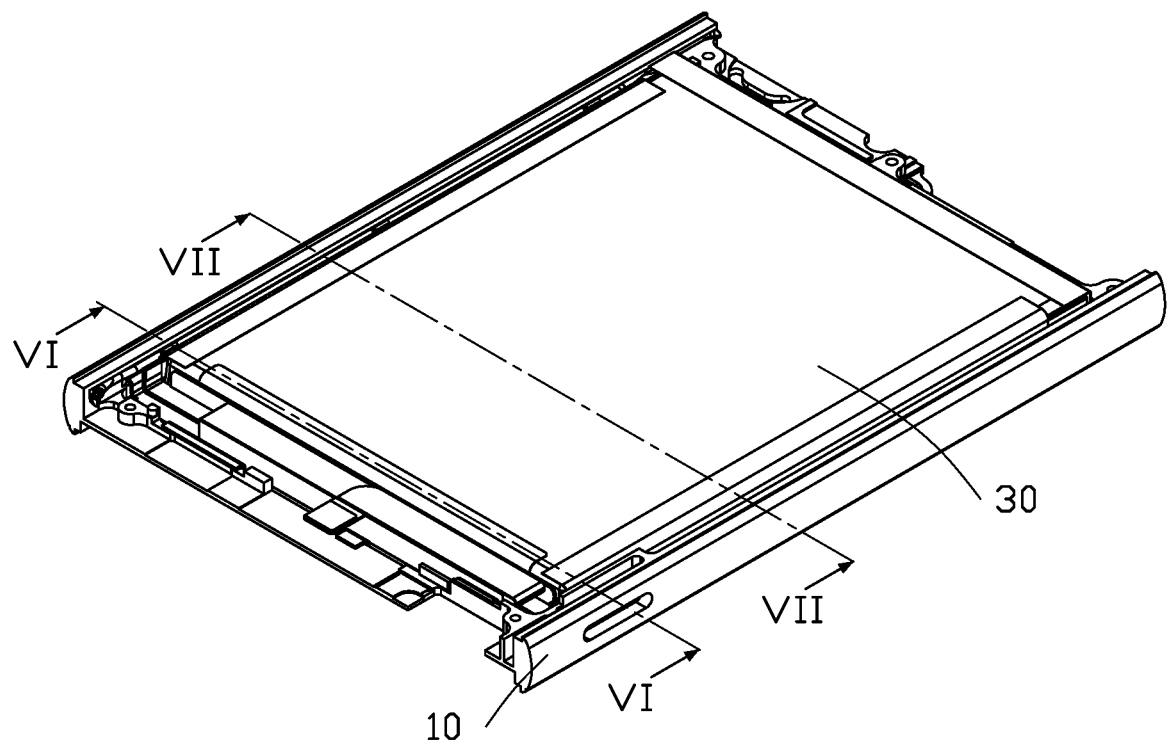
FIG. 2 is a perspective view of a portion of the electronic device in FIG. 1.
Figure 3:
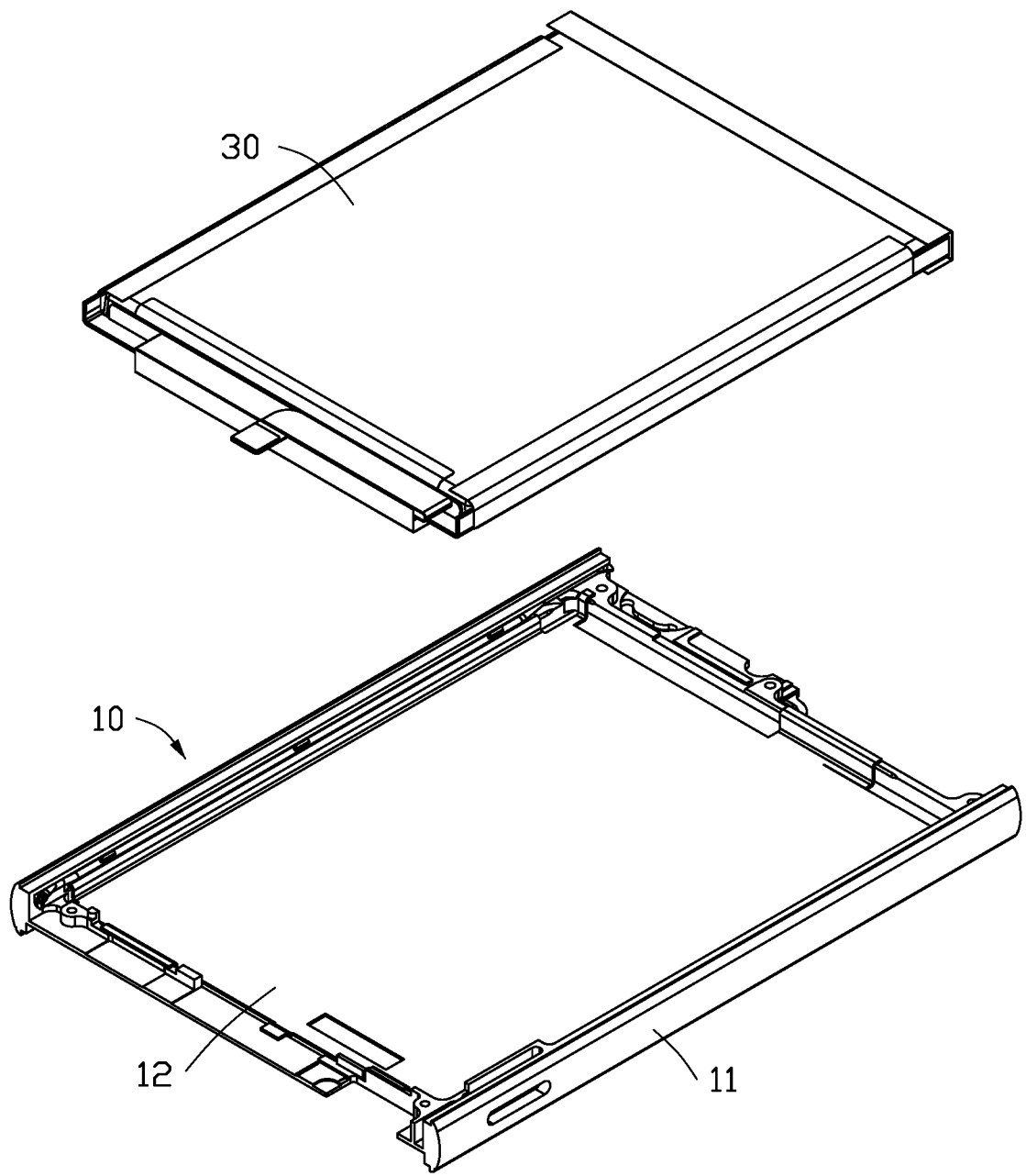
FIG. 3 is an exploded schematic view of the portion of the electronic device in FIG. 2.

Referring to FIG. 2 and FIG. 3, the electronic device 100 includes a housing assembly 10. The housing assembly 10 includes a first housing 11 and a second housing 12 disposed in the first housing 11.

Figure 4:
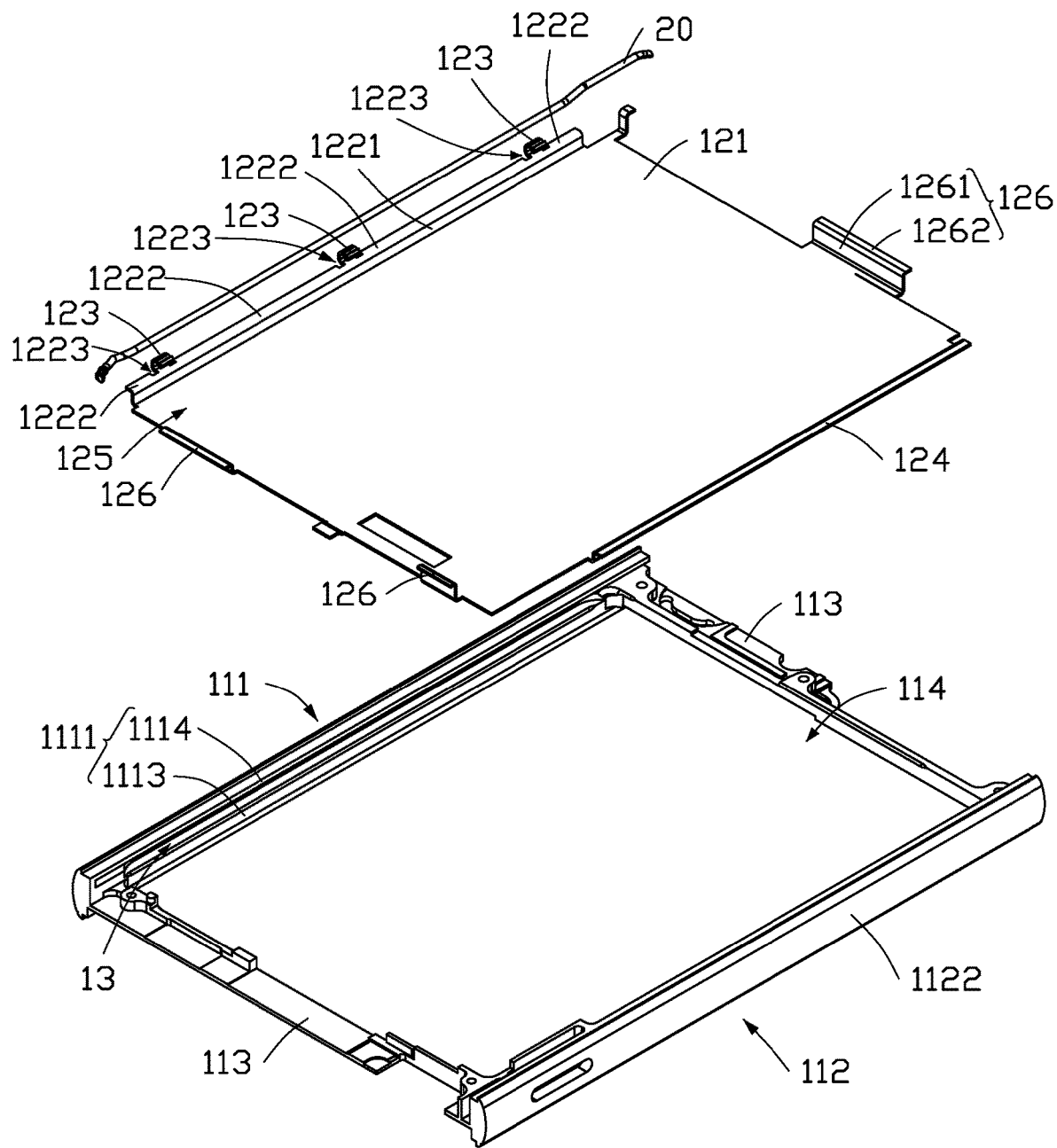
FIG. 4 is an exploded schematic view of a housing assembly of the electronic device in FIG. 3.

Referring to FIG. 4, the first housing 11 is ring-shaped. A surface of the first housing 11 facing the second housing 12 defines a groove 13.

In at least one embodiment, the first housing 11 is a middle frame of a mobile phone, and is rectangular and hollow. The first housing 1 includes a first side wall 111, a second side wall 112, and two third side walls 113. The first side wall 111 faces the second side wall 112, and the two third side walls 113 face each other. The two third side walls 113 are connected between the first side wall 111 and the second side wall 112 to form an accommodating space 114. The second housing 12 is received in the accommodating space 114. The groove 13 is disposed on the first side wall 111. In other embodiments, the groove 13 may be disposed on the second side wall 112.

Figure 5:
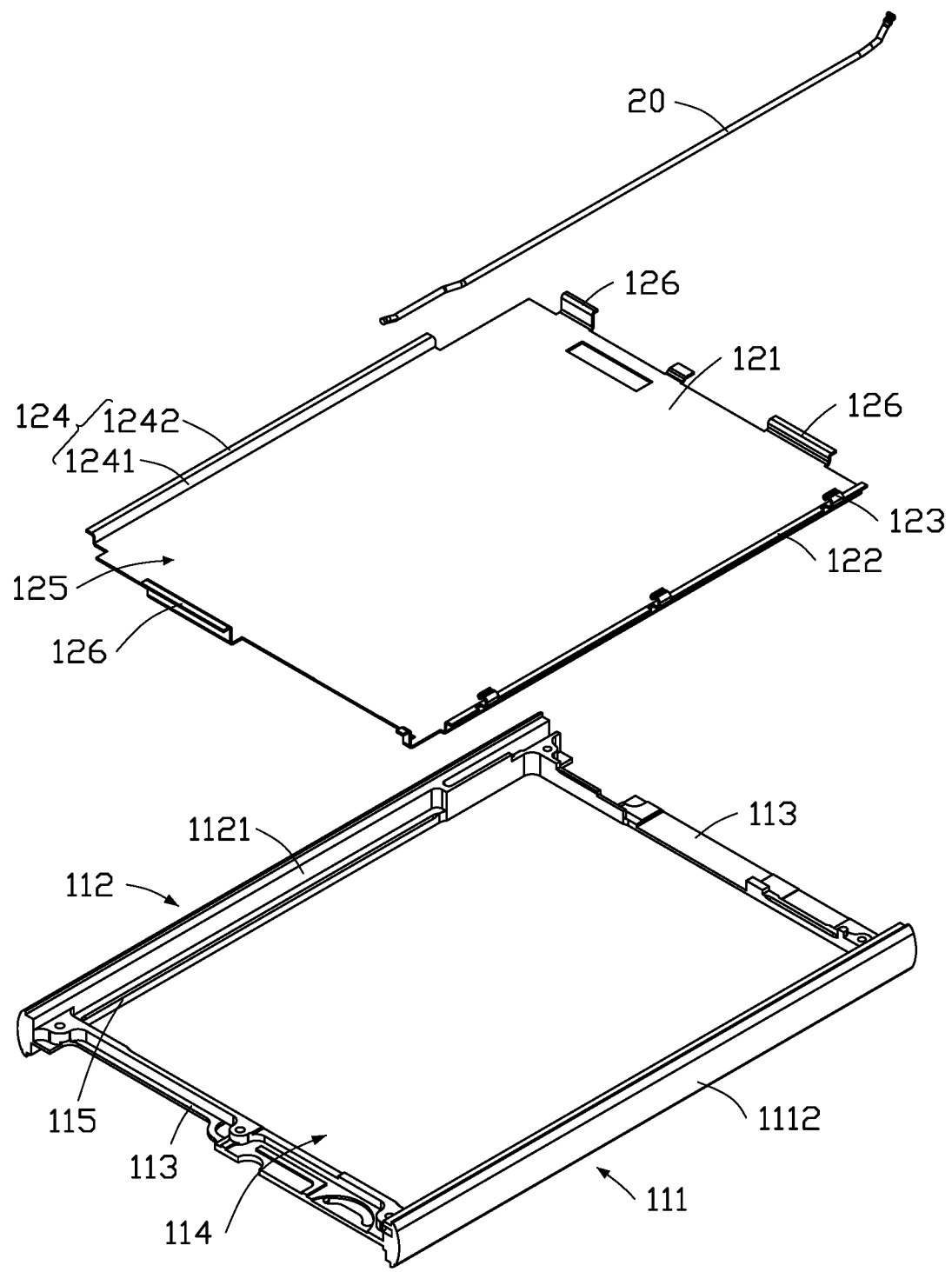
FIG. 5 is an exploded schematic view of the housing assembly of the electronic device in FIG. 3 from another angle.

Referring to FIGS. 4 and 5, the first side wall 111 includes a first inner surface 1111 and a first outer surface 1112 opposite to the first inner surface 1111. The first inner surface 1111 faces the second side wall 112. The first inner surface 1111 is recessed toward the first outer surface 1112 to form the groove 13. The groove 13 divides the first inner surface 1111 into a first surface 1113 and a second surface 1114. The groove 13 is disposed between the first surface 1113 and the second surface 1114. In at least one embodiment, the groove 13 is strip-shaped, which extends from one third side wall 113 toward the other third side wall 113.

In other embodiments, the first housing 11 may be in a shape of a rhombus, an ellipse, or a triangle.

Referring to FIGS. 4 and 5, the second housing 12 includes a bottom plate 121, a first side plate 122, a fastener 123, and a second side plate 124. The first side plate 122 faces the second side plate 124. The first side plate 122 and the second side plate 124 are disposed on sides of the bottom plate 121 to form a receiving space 125. The fastener 123 is disposed on the first side plate 122. When the first housing 11 connects to the second housing 12, the fastener 123 is received in the groove 13. The groove 13 provides a space for receiving the fastener 123 without occupying the accommodating space 114, thereby increasing the size of the receiving space 125. In at least one embodiment, the bottom plate 121, the first side plate 122, the fastener 123, and the second side plate 124 are integrally formed. In one embodiment, a thickness of the second housing 12 is about 0.3 mm.

In other embodiments, the fastener 123 may be disposed on the second side plate 124.

Referring to FIGS. 3, 4, and 5, the first side plate 122 is connected to the first side wall 111, and the second side plate 124 is connected to the second side wall 112, so that the first housing 11 is connected to the second housing 12.

In one embodiment, the first side plate 122 is connected to the first side wall 111 through welding, and the second side plate 124 is connected to the second side wall 112 through welding. The first housing 11 is made of aluminum alloy, and the second housing 12 is made of stainless steel. When a strain test is performed on the housing assembly 10 at room temperature, the welding strength between the first side plate 122 and the first side wall 111 is 1405N-730N, and the welding strength between the second side plate 124 and the second side wall 112 is 1405N-1730N.

Figure 7:
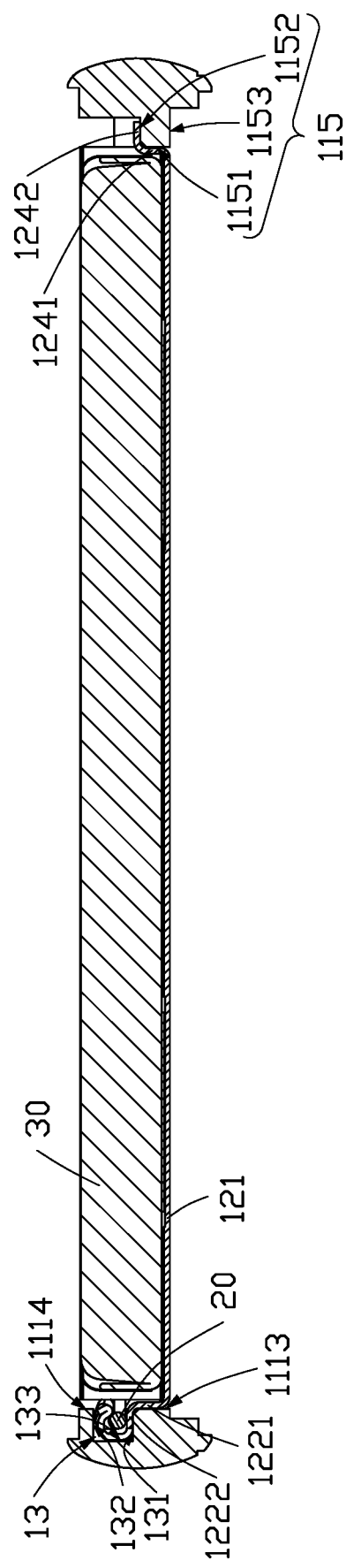
FIG. 7 is a cross sectional view taken along line VII-VII of FIG. 2.

Referring to FIG. 4, the first side plate 122 includes a first plate 1221 and a second plate 1222. The first plate 1221 is disposed on an edge of the bottom plate 121. A side of the first plate 1221 away from the bottom plate 121 extends toward the first side wall 111 to form the second plate 1222. Referring to FIG. 7, in at least one embodiment, the first plate 1221 faces the first surface 1113, and the first plate 1221 is spaced apart from the first surface 1113 to form an assembly gap to ensure the second housing 12 can be assembled to the first housing 11. A distance between the first plate 1221 and the first surface 1113 is 0.05 mm. The second plate 1222 is received in the groove 13.

Referring to FIG. 7, the groove 13 includes a first side surface 131, a second side surface 132, and a first connecting surface 133 connected between the first side surface 131 and the second side surface 132. The first side surface 131 faces the second side surface 132. The first side surface 131 is connected to the first surface 1113, and the second side surface 132 is connected to the second surface 1114. The second plate 1222 is connected to the first side surface 131.

In one embodiment, the second plate 1222 is connected to the first side surface 131 by welding.

Referring to FIG. 4, in at least one embodiment, the first side plate 122 includes a plurality of the second plates 1222. The plurality of the second plates 1222 are spaced apart from each other to form gaps 1223. The fastener 123 is disposed on a side of the first plate 1221 away from the bottom plate 121 and disposed in the gap 1223.

Figure 6:
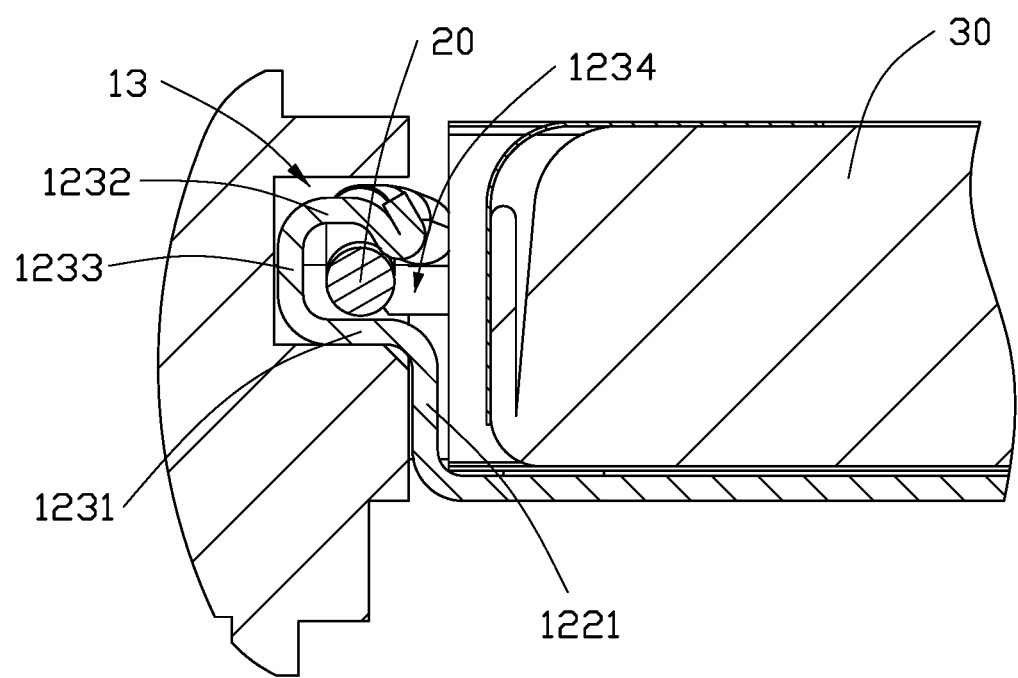
FIG. 6 is a portion of a cross sectional view taken along line VI-VI of FIG. 2.

Referring to FIG. 6, the fastener 123 includes a first engaging portion 1231, a second engaging portion 1232, and a connecting portion 1233 connected between the first engaging portion 1231 and the second engaging portion 1232. The first engaging portion 1231 is disposed in the gap 1223. The side of the first plate 1221 away from the bottom plate 121 extends outward to form the first engaging portion 1231. The first engaging portion 1231 is parallel to the second plate 1222. The second engaging portion 1232 faces the first engaging portion 1231, and is spaced apart from the first engaging portion 1231 to form an opening 1234. The opening 1234 faces the second side wall 112. A size of the opening 1234 can be adjusted according to the spacing between first engaging portion 1231 and the second engaging portion 1232. In other embodiments, the number of the fasteners 123 may be varied.

In other embodiments, the fastener 123 may be formed by bending the second plate 1222.

Referring to FIGS. 4 and 5, in at least one embodiment, the second side plate 124 includes a third plate 1241 and a fourth plate 1242. The third plate 1241 is disposed on an edge of the bottom plate 121. A side of the third plate 1241 away from the bottom plate 121 extends toward the second side wall 112 to form the fourth plate 1242. The second side plate 124 is in a shape of an inverted L.

The second side wall 112 includes a second inner surface 1121 and a second outer surface 1122 opposite to the second inner surface 1121. The second inner surface 1121 faces the first side wall 111. A bump 115 is disposed on the second inner surface 1121. In at least one embodiment, the bump 115 is strip-shaped. The bump 115 is disposed at the bottom of the second inner surface 1121 and extends from one third side wall 113 toward the other third side wall 113. Referring to FIG. 7, the bump 115 includes a second connection surface 1151, a third side surface 1152, and a fourth side surface 1153 opposite to the third side surface 1152. The second connection surface 1151 is connected between the third side surface 1152 and the fourth side surface 1153. The third plate 1241 faces the second connection surface 1151, and the third plate 1241 is spaced apart from the second connection surface 1151 to form an assembly gap to ensure the second housing 12 is assembled to the first housing 11. A distance between the third plate 1241 and the second connection surface 1151 is 0.05 mm. The fourth plate 1242 is connected to the third side surface 1152. In one embodiment, the third side surface 1152 is connected to the fourth plate 1242 by welding.

Further, referring to FIGS. 4 and 5, the second housing 12 further includes a connecting plate 126. The connecting plate 126 is connected to at least one third side wall 113 to improve the strength of connection between the second housing 12 and the first housing 11. In at least one embodiment, one connecting plate 126 is connected to each of the two third side walls 113. In other embodiment, the second housing 12 may include two connecting plates 126, or three connecting plates 126.

In at least one embodiment, the connecting plate 126 includes a first connecting plate 1261 and a second connecting plate 1262. The first connecting plate 1261 is disposed on an edge of the bottom plate 121. The second connecting plate 1262 extends from a side of the first connecting plate 1261 away from the bottom plate 121 toward the third side wall 113 and contacts the third side wall 113. The connecting plate 126 is in a shape of an inverted L. In one embodiment, the connecting plate 126 is welded to the third side wall 113 through the second connecting plate 1262.

The second housing 12 is welded to the first housing 11 by the first side plate 122, the second side plate 124, and the connecting plate 126, thereby improving the connection strength of the housing assembly 10.

In other embodiments, the connecting plate 126 may be omitted.

Referring to FIGS. 3, 4, and 5, the electronic device 100 further includes a wire 20. In at least one embodiment, the wire 20 is an RF line (Radio-Frequency Line). The wire 20 is disposed in the fastener 123 through the opening 1234. The wire 20 is thereby fixed, and undesired movements of the wire 20 can be avoided.

Further, referring to FIGS. 2, 3, and 4, the electronic device 100 further includes a battery 30 received in the receiving space 125.

In at least one embodiment, the diameter of the wire 20 is 1.02 mm, and the thickness of the fastener 123 is 0.58 mm. The second housing 12 is made of stainless steel. The thickness of the second housing 12 is 0.3 mm.

Conventionally, the wires of an electronic device are arranged in a receiving space, which decreases the size of a battery that can be received in the receiving space. In addition, a thickness of a middle frame is generally 0.6 mm. Therefore, if the receiving space of the electronic device can only accommodate the battery with a length of 83.5 mm, a width of 60.2 mm, and a height of 3.85 mm, the battery can have a capacity of only 3230 mAh.

In the present disclosure, the groove 13 increases the receiving space 125 to a width of 1.6 mm (including the diameter of the wire 20 of 1.02 mm and the thickness of the fastener 123 of 0.58 mm). In addition, the thickness of the second housing 12 is 0.3 mm. Then, in the present disclosure, the receiving space 125 can accommodate a battery 30 with a length of 83.5, a width of 61.8 mm (60.2 mm+1.6 mm), and a height of 4.15 mm (3.85 mm+0.3 mm). Such the battery 30 can have a capacity of 3585 mAh. Compared with the conventional battery, the capacity of the battery 30 is increased by 11%, that is, (3585 mAh-3230 mAh)/3230 mAh=11%.

In summary, the fastener 123 is hidden in the groove 13 of the first housing 11 to compress the space of the fastener 123, thereby reducing the volume of occupation of the second housing 12 in the first housing 11, increasing the space of the receiving space 125 for receiving the battery 30, and allowing the battery 30 to have greater power. In addition, the arrangement of the fastener 123 also plays a role of fixing the wire 20, regulating the arrangement of the wire 20, and preventing jumpers.

It is to be understood, however, that even through numerous characteristics and advantages of the present disclosure have been set forth in the foregoing description, together with details of assembly and function, the disclosure is illustrative only, and changes may be made in details, especially in the matters of shape, size, and arrangement of parts within the principles of the disclosure to the full extent indicated by the broad general meaning of the terms in which the appended claims are expressed.

What is claimed is:

1. A housing assembly, comprising:
a first housing, and
a second housing receiving in the first housing;
wherein a groove is formed on a surface of the first housing facing the second housing, the second housing comprises a first side plate, a second side plate facing the first side plate, a bottom plate, and a fastener, the first side plate and the second side plate are disposed on sides of the bottom plate to form a receiving space, the first side plate and the second side plate are connected to the first housing, the fastener is disposed on the first side plate or the second side plate, and received in the groove;
wherein the first housing is ring-shaped, the first housing comprises a first side wall, a second side wall, and two third side walls, the first side wall faces the second side wall, the two third side walls face each other, the two third side walls are connected between the first side wall and the second side wall, the first side wall comprises a first inner surface and a first outer surface opposite to the first inner surface, the first inner surface faces the second side wall, the first inner surface is recessed toward the first outer surface to form the groove, the groove divides the first inner surface into a first surface and a second surface.

2. The housing assembly of claim 1, wherein the first side plate comprises a first plate and at least one second plate, the first plate is disposed on an edge of the bottom plate, a side of the first plate away from the bottom plate extends toward the first side wall to form the at least one second plate, the first plate faces the first surface, and is spaced apart from the first surface, the second plate is received in the groove.

3. The housing assembly of claim 2, wherein the first side plate comprises at least two second plates, the at least two second plates are spaced apart from each other to form a gap, the fastener is disposed on the side of the first plate away from the bottom plate and disposed in the gap.

4. The housing assembly of claim 3, wherein the fastener comprises a first engaging portion, a second engaging portion, and a connecting portion connected between the first engaging portion and the second engaging portion, the first engaging portion is disposed in the gap, the side of the first plate away from the bottom plate extends outward to form the first engaging portion, the first engaging portion is parallel to the second plate, the second engaging portion faces the first engaging portion, and is spaced apart from the first engaging portion.

5. The housing assembly of claim 1, wherein the second side plate comprises a third plate and a fourth plate, the third plate is disposed on an edge of the bottom plate, a side of the third plate away from the bottom plate extends toward the second side wall to form the fourth plate.

6. The housing assembly of claim 5, wherein the second side wall comprises a second inner surface and a second outer surface opposite to the second inner surface, the second inner surface faces the first side wall, a bump is disposed on the second inner surface, the third plate faces the bump and is space apart from the bump, the fourth plate is connected to the bump.

7. The housing assembly of claim 1, wherein the second housing further comprises a connecting plate, the connecting plate is disposed on an edge of the bottom plate, and connected to the third side wall.

8. An electronic device comprising:
a wire; and
a housing assembly comprising:
a first housing, and
a second housing receiving in the first housing;
wherein a groove is formed on a surface of the first housing facing the second housing, the second housing comprises a first side plate, a second side plate facing the first side plate, a bottom plate, and a fastener, the first side plate and the second side plate are disposed on sides of the bottom plate to form a receiving space, the first side plate and the second side plate are connected to the first housing, the fastener is disposed on the first side plate or the second side plate, and received in the groove, the wire is disposed in the fastener;
wherein the first housing is ring-shaped, the first housing comprises a first side wall, a second side wall, and two third side walls, the first side wall faces the second side wall, the two third side walls face each other, the two third side walls are connected between the first side wall and the second side wall, the first side wall comprises a first inner surface and a first outer surface opposite to the first inner surface, the first inner surface faces the second side wall, the first inner surface is recessed toward the first outer surface to form the groove, the groove divides the first inner surface into a first surface and a second surface.

9. The electronic device of claim 8, wherein the first side plate comprises a first plate and at least one second plate, the first plate is disposed on an edge of the bottom plate, a side of the first plate away from the bottom plate extends toward the first side wall to form the at least one second plate, the first plate faces the first surface, and is spaced apart from the first surface, the second plate is received in the groove.

10. The electronic device of claim 9, wherein the first side plate comprises at least two second plates, the at least two second plates are spaced apart from each other to form a gap, the fastener is disposed on the side of the first plate away from the bottom plate and disposed in the gap.

11. The electronic device of claim 10, wherein the fastener comprises a first engaging portion, a second engaging portion, and a connecting portion connected between the first engaging portion and the second engaging portion, the first engaging portion is disposed in the gap, the side of the first plate away from the bottom plate extends outward to form the first engaging portion, the first engaging portion is parallel to the second plate, the second engaging portion faces the first engaging portion, and is spaced apart from the first engaging portion.

12. The electronic device of claim 8, wherein the second side plate comprises a third plate and a fourth plate, the third plate is disposed on an edge of the bottom plate, a side of the third plate away from the bottom plate extends toward the second side wall to form the fourth plate.

13. The electronic device of claim 12, wherein the second side wall comprises a second inner surface and a second outer surface opposite to the second inner surface, the second inner surface faces the first side wall, a bump is disposed on the second inner surface, the third plate faces the bump and is space apart from the bump, the fourth plate is connected to the bump.

14. The electronic device of claim 8, wherein the second housing further comprises a connecting plate, the connecting plate is disposed on an edge of the bottom plate, and connected to the third side wall.

15. The electronic device of claim 8, further comprising a battery received in the receiving space.

\* \* \* \* \*